United States Patent
Otremba et al.

(10) Patent No.: US 8,697,497 B2
(45) Date of Patent: Apr. 15, 2014

(54) MODULE WITH SILICON-BASED LAYER

(75) Inventors: Ralf Otremba, Kaufbeuren (DE); Xaver Schloegel, Sachsenkarm (DE); Christof Matthias Schilz, Malacca (MY)

(73) Assignee: Infineon Technologies AG, Neubiberg (DE)

( * ) Notice: Subject to any disclaimer, the term of this patent is extended or adjusted under 35 U.S.C. 154(b) by 14 days.

(21) Appl. No.: 13/281,955

(22) Filed: Oct. 26, 2011

(65) Prior Publication Data

US 2012/0070941 A1 Mar. 22, 2012

Related U.S. Application Data

(62) Division of application No. 11/673,303, filed on Feb. 9, 2007, now Pat. No. 8,093,713.

(51) Int. Cl.
*H01L 21/56* (2006.01)

(52) U.S. Cl.
USPC .................................. 438/127; 257/E21.502

(58) Field of Classification Search
None
See application file for complete search history.

(56) References Cited

U.S. PATENT DOCUMENTS

| | | | | |
|---|---|---|---|---|
| 4,855,809 A * | 8/1989 | Malhi et al. | | 257/684 |
| 4,922,378 A | 5/1990 | Malhi et al. | | |
| 5,147,822 A | 9/1992 | Yamazaki et al. | | |
| 5,276,087 A * | 1/1994 | Fujiki et al. | | 524/786 |
| 5,563,436 A | 10/1996 | Barret et al. | | |
| 6,033,937 A | 3/2000 | Manteghi | | |
| 6,045,877 A * | 4/2000 | Gleason et al. | | 427/522 |
| 6,177,726 B1 | 1/2001 | Manteghi | | |
| 6,403,510 B1 | 6/2002 | Kuibira et al. | | |
| 6,811,761 B2 | 11/2004 | Brese et al. | | |
| 6,923,363 B2 | 8/2005 | Masuda | | |
| 8,269,338 B2 * | 9/2012 | Chou et al. | | 257/706 |
| 2001/0025990 A1 | 10/2001 | Hirano et al. | | |
| 2001/0049205 A1 | 12/2001 | Sandhu et al. | | |
| 2003/0011054 A1 | 1/2003 | Jeun et al. | | |
| 2004/0217369 A1 * | 11/2004 | Nitta et al. | | 257/99 |
| 2005/0110140 A1 | 5/2005 | Kuo et al. | | |
| 2006/0056213 A1 | 3/2006 | Lee et al. | | |
| 2006/0068515 A1 | 3/2006 | Li et al. | | |
| 2006/0273311 A1 * | 12/2006 | Ohe et al. | | 257/40 |
| 2008/0173984 A1 | 7/2008 | Lin et al. | | |

FOREIGN PATENT DOCUMENTS

DE  10336747 A1  3/2005

(Continued)

OTHER PUBLICATIONS

Non-Final Office Action mailed Dec. 11, 2008 in U.S. Appl. No. 11/673,303.

(Continued)

*Primary Examiner* — Wensing Kuo
(74) *Attorney, Agent, or Firm* — Dicke, Billig & Czaja, PLLC

(57) ABSTRACT

The invention concerns a module comprising a carrier element, a semiconductor device mounted on said carrier element and a silicon-based insulating layer. The silicon-based insulating layer is arranged on the side of the carrier element opposite to the semiconductor device. The invention further concerns a module comprising a semiconductor device, a mold compound at least partly covering the semiconductor device and a silicon-based passivation layer. The silicon-based passivation layer covers at least partly the periphery of the mold compound.

9 Claims, 3 Drawing Sheets

(56) References Cited

FOREIGN PATENT DOCUMENTS

| | | |
|---|---|---|
| DE | 69619604 T2 | 10/2011 |
| JP | 55148443 A | 11/1980 |
| JP | 59144159 A | 8/1984 |
| JP | 5275598 A | 10/2011 |
| WO | 8802554 A1 | 4/1988 |
| WO | 0121393 A1 | 3/2001 |

OTHER PUBLICATIONS

Final Office Action mailed Jun. 9, 2009 in U.S. Appl. No. 11/673,303.
Non-Final Office Action mailed Jun. 9, 2010 in U.S. Appl. No. 11/673,303.
Non-Final Office Action mailed Nov. 24, 2010 in U.S. Appl. No. 11/673,303.
Final Office Action mailed May 2, 2011 in U.S. Appl. No. 11/673,303.

* cited by examiner

MODULE WITH SILICON-BASED LAYER

CROSS-REFERENCE TO RELATED APPLICATIONS

This Utility Patent Application is a divisional application of U.S. application Ser. No. 11/673,303, filed Feb. 9, 2007, which is incorporated herein by reference.

BACKGROUND

During operation of semiconductor devices and particularly power semiconductor devices a heat growth may occur, which may damage the semiconductor device itself or further components in the vicinity of the semiconductor device. Therefore, it is desirable to provide cooling means like heat sinks to cool down the semiconductor device by transporting heat away from it. Elements with a high thermal conductivity should be provided to connect the cooling means and the semiconductor device, in order to support efficient heat transport. Moreover, semiconductor devices may also be vulnerable to external influences like dirt, humidity or mechanical impact.

BRIEF DESCRIPTION OF THE DRAWINGS

Aspects of the invention are made more evident in the following detailed description of embodiments when read in conjunction with the attached drawing figures, wherein.

DETAILED DESCRIPTION OF THE DRAWINGS

The invention relates to a module comprising a semiconductor device mounted on a carrier element. The invention further relates to a module comprising a semiconductor device at least partly covered by a mold compound.

Modules described in the following comprise a semiconductor device, which for example may be an electrical, an electromechanical, an electro-optical or a power semiconductor device.

Examples for such semiconductor devices are integrated circuits, sensor chips or power transistors.

The modules further comprise a carrier element, on which the semiconductor device is mounted. The carrier element may be manufactured of a metal, an alloy, a dielectric, a plastic, a ceramic or a combination thereof. Preferably, the carrier element shows a good thermal conductivity. The carrier element may have a homogeneous structure, but may also provide internal structures like conducting paths with an electric redistributional function. Examples for such carrier elements are a die pad including a lead frame or a resin or ceramic substrate including one or more redistribution layers.

The described modules may further comprise a mold compound, whose implementation may be arbitrary. The mold compound may for example be made of epoxy resin or silicone.

Figure 1:
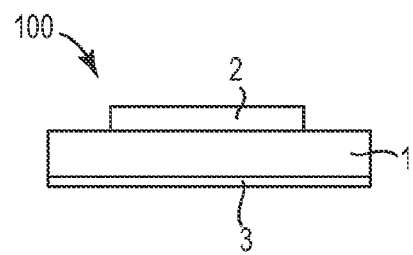
FIG. 1 shows a sectional side view of a first module.

Identical or similar parts of the accompanying drawings are denoted by the same reference signs. FIG. 1 shows a schematic sectional side view of a module 100 representing a first embodiment. The module 100 comprises a carrier element 1 with a semiconductor device 2 mounted on it. The module 100 further comprises a silicon-based insulating layer 3 arranged on the side of the carrier element 1 opposite to the semiconductor device 2. Due to the insulating character of the silicon-based insulating layer 3, possible short circuits between the carrier element 1 (respectively the semiconductor device 2) and further elements (not shown) are avoided.

During operation, the semiconductor device 2 may become hot, and in order to avoid malfunction or damage, the heat should be transported away from it. One possible path for this heat transport proceeds over the carrier element 1 and the silicon-based insulating layer 3. Accordingly, it is preferable for the carrier element 1 and the silicon-based insulating layer 3 to own a high thermal conductivity in order to effectively support said heat transport.

Insulating layers based on silicon may provide high thermal conductivities. Two specific examples of such silicon-based layers are silicon carbide layers and silicon oxide layers. As a further example, said silicon-based layer may be a diamond-like-carbon (DLC) layer doped with silicon. The silicon-based insulating layer 3 may be pure (except for contaminations that cannot be avoided in the underlying production processes) or may respectively be doped with impurity atoms and/or groups of impurity atoms. All types of impurity atoms or groups of impurity atoms may be used as long as it is physically, chemically and technically possible to dope the silicon-based insulating layer 3 with such atoms or groups of atoms.

It is further possible to dope the silicon-based insulating layer 3 not only with one specific impurity atom type and/or one specific type of groups of impurity atoms, but to provide arbitrary doping combinations. Specific examples for impurity atoms are metal atoms in general, oxygen atoms, nitrogen atoms or hydrogen atoms. A specific example for a group of impurity atoms is a hydroxide group. Moreover, the doping concentrations of the impurity atoms or groups of impurity atoms shall generally not be constricted to a specific value or a specific value range. Different types of impurity atoms or groups of impurity atoms may also have different doping concentrations. Preferably, the doping concentration of the impurity atoms or the groups of impurity atoms lies in the range between 0.1% and 10%.

A specific example of such a silicon-based insulating layer 3 is an amorphous layer of silicon carbide including hydrogen atoms, which is commonly referred to as SiC:H. A further example of a doped silicon-based insulating layer 3 is a silicon oxide layer including hydroxide groups, i.e. $SiO_{2-x}(OH)_x$ (with the value of x particularly lying between 0 and 1). These two examples of a silicon-based insulating layer 3 provide a high thermal conductivity and are therefore suitable to support efficient heat transport away from the semiconductor device 2.

For an improved heat transport, the thermal resistance of the silicon-based insulating layer 3 should be as low as possible, i.e. a small thickness of the silicon-based insulating layer 3 is preferred. The thickness of the silicon-based insulating layer 3 may be less than 100 μm, particularly 10 μm.

This thickness is superior in comparison to conventional insulating layers made of mold compounds. Due to the available methods for deposition of such mold layers, their thickness usually lies between 300 μm and 600 μm. These high values lead to an increased thermal resistance that impedes the desired heat transport away from the semiconductor device 2. Further, mold compound layers are based on polymer materials, whereas the silicon-based insulating layers 3 according to the invention preferably do not comprise polymers, i.e. contributions of plastic.

The silicon-based insulating layer 3 may have heat conductivities higher than 300 W/mK. DLC-layers may even have heat conductivities higher than 600 W/mK. It is further pointed out that an employment of described silicon-based insulating layers offers the possibility of retaining (i.e. not decreasing) the value for the withstand voltage during a minimization of the thermal resistance.

During production of the module 100, the silicon-based insulating layer 3 is deposited on the side of the carrier element 1 opposite to the side on which the semiconductor device 2 is or is to be mounted. In practice, various processes may be used for deposition, for example, chemical vapor deposition (CVD), Ion-Beam CVD, physical vapor deposition (PVD) or plasma pyrolysis processes. The process conduct, i.e. the selection of process parameters determining these processes allows one to alter the electrical, thermal and mechanical properties of the silicon-based insulating layer 3 and accordingly provides the possibility to minimize the thermal resistance. The usage of above mentioned deposition methods leads to a silicon-based insulating layer 3 of a homogeneous and amorphous structure.

Figure 2:
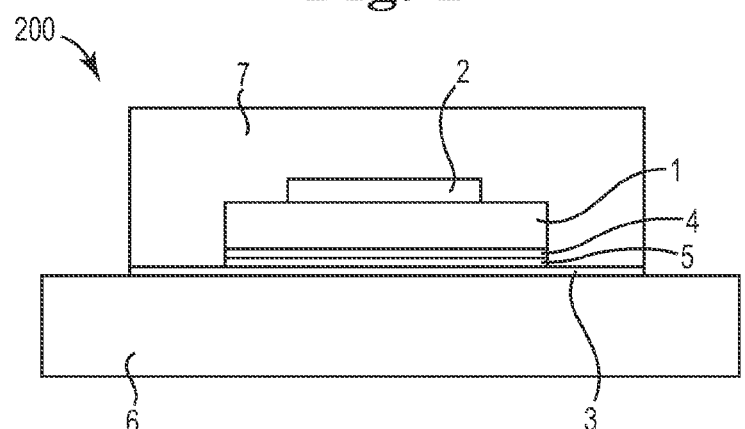
FIG. 2 shows a sectional side view of a second module.

FIG. 2 shows a module 200 according to a further embodiment. Similar to the module 100, the module 200 comprises a carrier element 1 with a semiconductor device 2 mounted on it and a silicon-based insulating layer 3 arranged on the side of the carrier element 1 opposite to the semiconductor device 2. The module 200 further optionally comprises additional layers 4 and 5 disposed on the side of the carrier element 1 opposite to the semiconductor device 2. The layer 4 is a metal oxide layer coating the carrier element 1. The silicon-based insulating layer 3 contacts a heat sink 6 provided for cooling the module (and particularly the semiconductor device 2). The carrier element 1, the semiconductor device 2, as well as the layers 3, 4 and 5 may be covered by a mold compound 7.

During operation of the semiconductor device 2, a heat transport away from the same is desirable in order to avoid damage. One possible path for this heat transport is directed through the layers 3, 4 and 5. For a good thermal conductivity, the carrier element 1 may be made of a metal to provide a low thermal resistance. In the case of the carrier element 1 being made of a metal, an improved adhesion of the layer 4 coating the carrier element 1 is provided, if the layer 4 is a metal oxide layer. It is particularly preferable, if the metal oxide layer 4 is based on the same metal the carrier element 1 is made of. For example, the metal oxide layer 4 may be made of aluminum oxide, titanium oxide, chrome oxide, zinc oxide and/or combinations thereof. One possibility to deposit the metal oxide layer 4 in order to provide a good adhesion is a galvanic deposition procedure. Using such a procedure, metal oxide layers with a reduced thickness down to the nanometer scale are realizable.

The module 200 comprises a further layer 5 arranged on the side of the carrier element 1 opposite to the semiconductor device 2. This layer may be a further silicon-based layer of the type already described above, but may also be another metal oxide layer or any arbitrary layer that preferably provides a high thermal conductivity. It is obvious that multiple layers may be deposited on the side of the carrier element 1 opposite to the semiconductor device 2 in order to improve the thermal conductivity, the stability and further important properties of the module 200. The material composition and the geometric arrangement of these multiple layers may vary, depending on the desired properties. It is further understood that modules according to the present invention may comprise multiple semiconductor devices and correspondingly multiple silicon-based insulating layers and/or metal oxide layers.

The silicon-based insulating layer 3 is connected to a heat sink 6. Preferably, the heat sink 6 is manufactured of material with a high thermal conductivity, i.e. for instance a metal or an alloy. Due to the insulating behavior of the silicon-based insulating layer 3 (and eventually further layers between the heat sink 6 and the carrier element 1), the danger of possible short circuits between the carrier element 1 (respectively the semiconductor device 2) and the heat sink 6 is avoided.

In the specific case of FIG. 2 the carrier element 1, the semiconductor device 2 and the layers 3, 4 and 5 are completely covered by the mold compound 7. It is however understood that it is also possible for the mold compound 7 to only cover single elements or arbitrary combinations of elements of the module 200. The covering by the mold compound 7 may also be only partly, i.e. elements of the module 200 do not need to be completely covered by the mold compound 7. The mold compound 7 is not restricted to consist of a specific material and combinations of different materials are also possible. The mold compound 7 usually serves to protect elements of the module 200 against environmental influences like dirt, humidity or mechanical impact. It may also be used to support a heat transport away from the semiconductor device 1. The silicon-based insulating layer 3 is preferably (but not necessarily) arranged between the heat sink 6 and the mold compound 7 in order to avoid negative electric or magnetic effects that may occur in case of the heat sink 6 directly contacting the mold compound 7. Thus, such damages of the semiconductor device 2 or further elements around are avoided.

Not explicitly shown in FIG. 2 are electrical module elements (if necessary) that provide an electrical connection between the semiconductor device 2 and possible exterior applications. In the case of a module including elements completely covered by the mold compound 7, such an electrical connection may be realized by means of a lead frame with its pins providing the desired electrical connection. An electrical connection between the electrical contacts of the semiconductor device 2 and the lead frame may, for example, be realized by bonding wires.

Figure 3A:
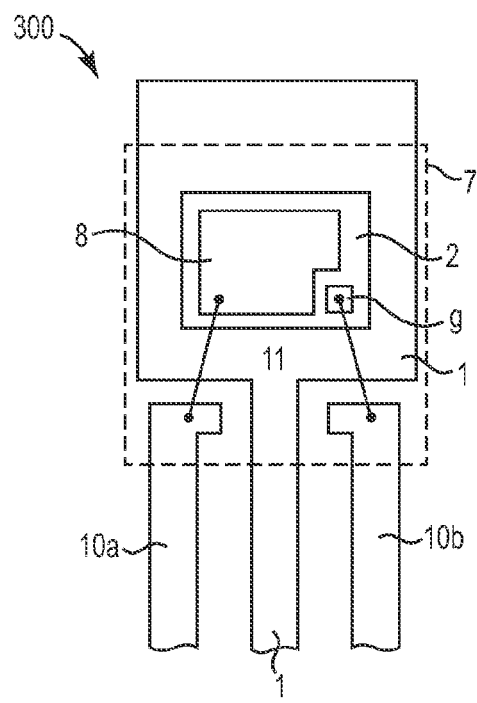
FIG. 3*a* shows a top plan view of a third module.
Figure 3B:
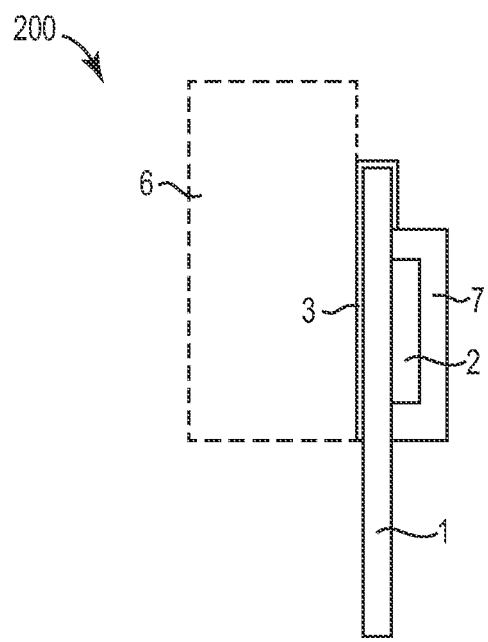
FIG. 3*b* shows a sectional side view of a third module.

FIG. 3a shows a module 300 according to another embodiment in a top plan view, while FIG. 3b shows the same module 300 in a sectional side view. The module 300 represents a power transistor module comprising a semiconductor device in form of a transistor chip 2 mounted on a carrier element 1. The module 300 further comprises a silicon-based insulating layer 3 on the side of the carrier element 1 opposite to the transistor chip 2, which is not apparent in FIG. 3a due to the top view perspective. The bottom side of the transistor chip 2 represents its drain terminal, while the top side of the transistor chip 2 provides a gate terminal 8 and a source terminal 9. The transistor chip 2 is mounted with its bottom side on the carrier element 1, which in this embodiment is formed to have a terminal leg V. The transistor chip 2 is covered by a mold compound 7 (indicated by the dashed line in FIG. 3a) with three terminal legs 1', 10a and 10b projecting out of the mold compound 7. The terminal legs 1', 10a and 10b provide an electrical connection to possible exterior applications. The terminal leg 1' constitutes the drain terminal, while the two other terminal legs 10a and 10b are respectively connected to the gate terminal 8 and the source terminal 9 via bond wires 11.

Similar to the module 200, the heat transport in the module 300 preferably occurs in a direction to a heat sink 6 (not apparent in FIG. 3a due to the top view perspective) arranged on the bottom side of the carrier element 1. To avoid electrical currents between the transistor chip 2 and the heat sink 6 (which would provide the heat sink 6 with the potential of the drain terminal), a silicon-based insulating layer 3 (only shown in FIG. 3b due to the chosen perspective) is arranged on the backside of the carrier element 1 opposite to the transistor chip 2. The silicon-based insulating layer 3 is characterized by the properties already described in connection with modules 100 and 200. It is further included that additional layers may be deposited on the side of the carrier element 1 opposite to the transistor chip 2.

Figure 4:
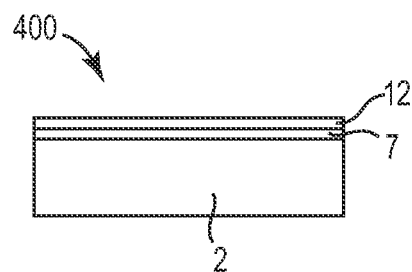
FIG. 4 shows a sectional side view of a fourth module.

According to a further aspect, FIG. 4 shows a module 400 which comprises a semiconductor device 2, a mold compound 7 at least partly covering the semiconductor device 2 and a silicon-based passivation layer 12 at least partly covering the periphery of the mold compound 7.

In the above, it was discussed that silicon-based layers provide a good thermal conductivity to support heat transport away from the semiconductor device 2. These silicon-based layers further exhibit advantageous mechanical properties, which can be exploited to protect elements of modules against environmental influences like dirt, humidity or mechanical impact. The silicon-based layers are scratch-resistant and, for example, gather less humidity than conventional mold compounds, which are often used for the protection of semiconductor devices.

For a passivation, the same silicon-based layers as described in connection with modules 100, 200 and 300 (see description above) may be used, i.e. the silicon-based passivation layer 12 may be identical to the silicon-based insulating layer 3. Accordingly, the silicon-based passivation layer 12 shows the same material and/or dimensional properties as the silicon-based insulating layers 3 described above. The possibility of the silicon-based insulating layer 3 and the silicon-based passivation layer 12 to be identical allows the deposit of the layers 3 and 12 during the same production process. Concerning the method for a deposition of the silicon-based passivation layer 12, identical processes as used for the deposition of the silicon-based insulating layer 3 may be used.

Figure 5:
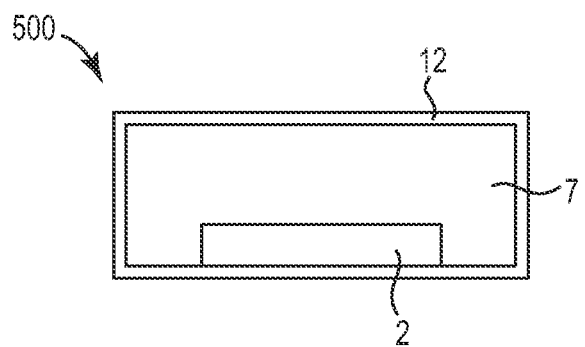
FIG. 5 shows a sectional side view of a fifth module.

According to a further embodiment illustrated in FIG. 5, a module 500 comprises the same elements as module 400, but in this case the silicon-based passivation layer 12 completely encloses all elements of the module 500. Thus, a good protection of the enclosed module elements is provided. Note that FIG. 4 and FIG. 5 only show examples of modules comprising a silicon-based passivation layer 12. It is understood that it is also possible to deposit a silicon-based passivation layer partially or completely enclosing the module on the modules 100, 200 and 300 as described above.

Although not explicitly shown in FIG. 5, it is obvious for a person skilled in the art that the module 500 (although completely enclosed by the silicon-based passivation layer 12) may further comprise elements to allow for an electrical connection to exterior applications. One example to provide such connections is using the pins (i.e. leads) of the lead frame, whose function was already discussed above.

Figure 6:
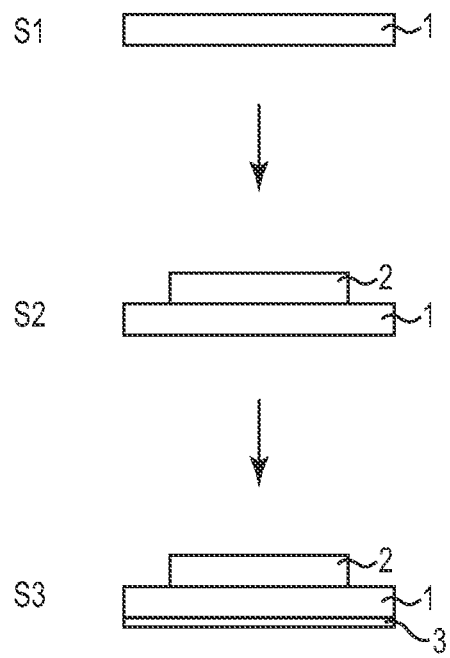
FIG. 6 shows a schematic illustration of a first possible method for the production of a module.

FIG. 6 shows a schematic illustration of a first embodiment of a method for the production of a module. In a first step S1, a carrier element 1 is provided. A second step S2 comprises the mounting of a semiconductor device 2 on said carrier element 1 and in a third step S3, a silicon-based insulating layer 3 is deposited on the side of the carrier element 1 opposite to the side on which the semiconductor device 2 is or is to be mounted. Note that the steps S2 and S3 are interchangeable regarding their chronology, which leads to two possibilities for the production sequence. In the first possible sequence, the carrier element 1 is first coated with the silicon-based insulating layer 3 and the semiconductor device 2 is mounted on the carrier element 1 afterwards. The other possibility comprises the mounting of the semiconductor device 2 on the carrier element 1 before the carrier element 1 is coated with the silicon-based insulating layer 3. The deposition of the silicon-based insulating layer 3 may be realized by one of the deposition processes described above.

Figure 7:
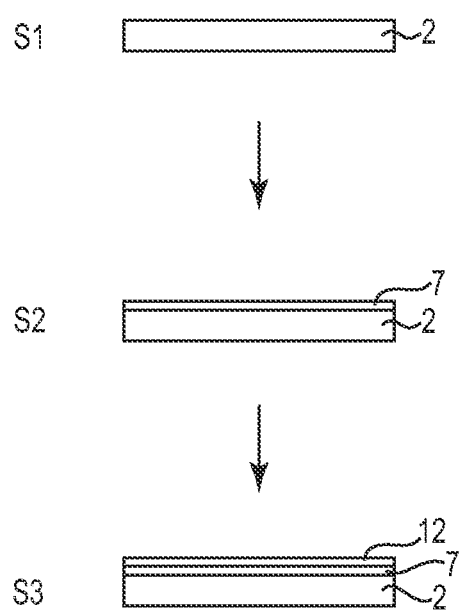
FIG. 7 shows a schematic illustration of a second possible method for the production of a module.

FIG. 7 shows a schematic illustration of a second embodiment of a method for the production of a module. The method comprises a first step S1, in which a semiconductor device 2 is provided. In a second step S2, a mold compound 7 is deposited thereon. The method further comprises a third step S3 of depositing a silicon-based passivation layer 12 on the periphery of the mold compound 7. Similar to the method illustrated in FIG. 6, the deposition of the silicon-based passivation layer 12 may be realized by one of the above described deposition processes.

A possible process to coat a whole module with the silicon-based passivation layer 12 (which would result in an embodiment similar to module 500), but still providing an electrical connection to exterior applications via, e.g. a lead frame including pins, comprises the step of firstly depositing the silicon-based passivation layer 12 on all elements of the module 500, including the lead frame with all of its pins. After the deposition of the silicon-based passivation layer 12, the silicon-based passivation layer 12 may be removed or stripped from the pins of the lead frame (or at least the parts of the pins representing terminals) in order to provide for exposed electrical contacts.

What is claimed is:

1. A method, comprising: providing a semiconductor device having a first major surface and a second major surface; depositing a mold compound on said semiconductor device such that the mold compound covers all sides of the semiconductor device except for the second major surface; and depositing a silicon-based passivation layer on a periphery of said mold compound and directly on the second major surface of the semiconductor device so that all surfaces of the mold compound and the second major surface of the semiconductor device are covered by the silicon-based passivation layer.

2. The method according to claim 1, wherein the passivation layer is a silicon carbide layer and/or a silicon oxide layer.

3. The method according to claim 1, wherein the passivation layer is doped with impurity atoms and/or groups of impurity atoms.

4. The method according to claim 3, wherein the impurity atoms and/or the groups of impurity atoms are given by metal atoms and/or oxygen atoms and/or nitrogen atoms and/or hydrogen atoms and/or hydroxide groups.

5. The method according to claim 3, wherein the doping concentration of the impurity atoms and/or groups of impurity atoms is between 0.1% and 10%.

6. The method according to claim 1, wherein the passivation layer is deposited to completely enclose a module formed by the semiconductor device and mold compound.

7. The method according to claim 1, wherein the passivation layer is deposited via a chemical vapor deposition (CVD) process.

8. The method according to claim 1, wherein the passivation layer is deposited via a physical vapor deposition (PVD) process.

9. The method according to claim 1, wherein the passivation layer is deposited via plasma pyrolysis.

\* \* \* \* \*